(12) United States Patent
Enriquez

(10) Patent No.: US 6,396,331 B1
(45) Date of Patent: May 28, 2002

(54) MECHANISM FOR MINIMIZING UNDESIRABLE EFFECTS OF PARASITIC COMPONENTS IN INTEGRATED CIRCUITS

(75) Inventor: Leonel Ernesto Enriquez, Melbourne Beach, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/686,514

(22) Filed: Oct. 11, 2000

(51) Int. Cl.$^7$ ............................................. H03K 17/30
(52) U.S. Cl. ....................... 327/382; 327/310; 327/314; 326/26
(58) Field of Search ................... 327/382, 383, 327/389, 391, 551, 310, 313, 314, 317; 326/26, 27, 30

(56) References Cited

U.S. PATENT DOCUMENTS

| | | | |
|---|---|---|---|
| 4,410,815 A | * 10/1983 | Ransom et al. | 326/83 |
| 4,868,424 A | * 9/1989 | Bosnyak et al. | 326/89 |
| 5,455,523 A | * 10/1995 | Wallace et al. | 326/89 |
| 6,020,764 A | * 2/2000 | Hada | 326/126 |

* cited by examiner

Primary Examiner—Terry D. Cunningham
Assistant Examiner—An T. Luu
(74) Attorney, Agent, or Firm—Allen, Dyer, Doppelt Mlibrath & Gilchrist, P.A.

(57) ABSTRACT

A compensation circuit for minimizing undesirable effects of parasitic components, such as a parasitic capacitance of a controlled electronic device (e.g., transistor) is coupled in parallel with the controlled electronic device in a manner that is effective to decrease the spurious AC signal-coupling of the parasitic component, such that the amplitude of the unwanted AC noise voltage across the load element is very significantly reduced, or effectively minimized. The parametric values of the transfer function of the electronic device in the by-pass compensation circuit are such as to attenuate the unwanted AC noise voltage across the load, by a factor that approximates the amplitude of the spurious signal, thereby effectively minimizing its unwanted contribution to the load voltage. As a non-limiting example, the invention may be employed to significantly reduce the effects of spurious AC signals induced in and transported over DC supply rails used to power a communication circuit, such as a subscriber line interface circuit.

10 Claims, 1 Drawing Sheet

MECHANISM FOR MINIMIZING UNDESIRABLE EFFECTS OF PARASITIC COMPONENTS IN INTEGRATED CIRCUITS

FIELD OF THE INVENTION

The present invention relates in general to electronic circuits, and is particularly directed to a parasitic component-based anomaly-compensating by-pass circuit that may be incorporated in one or more locations of an integrated circuit, for the purpose of minimizing undesirable effects of parasitic components, such as a parasitic capacitance of a controlled electronic device (e.g., transistor). As a non-limiting example, the invention may be employed to significantly reduce the effects of spurious AC signals induced in and transported over DC supply rails used to power a communication circuit, such as a subscriber line interface circuit.

BACKGROUND OF THE INVENTION

Systems employed by telecommunication service providers contain what are known as subscriber line interface circuits or 'SLIC's, which interface communication signals with tip and ring leads of a wireline pair serving a relatively remote piece of subscriber communication equipment. Present day SLICs are relatively low voltage integrated circuit architectures, designed to be interfaced with a variety of telecommunication circuits including those providing digital codec functionality. As such, a SLIC must conform with a very demanding set of performance requirements, including accuracy, linearity, insensitivity to common mode signals, low power consumption, low noise, filtering, and ease of impedance matching programmability. To this end, it is extremely important that any unwanted signals, such as spurious high frequency AC signals be induced into DC power rails and applied to electronic circuit components biased thereby, be minimized to the extent possible, so as avoid propagating such (noise) signals through parasitic capacitance components to signal nodes that will cause interference with the operation of the circuit.

This spurious signal loading problem is diagrammatically illustrated in the reduced complexity circuit example of FIG. 1, which shows a bipolar (PNP) transistor 10 having its emitter-collector current flow path coupled in circuit with an output node 15, shown as being coupled to a load device in the form of a resistor 16 referenced to ground. As a non-limiting example, transistor 10 may be part of a current mirror circuit, shown in broken lines 17, with its base 11 coupled in common with the base of one or more other current mirror transistors of the circuit. The collector 13 of transistor 10 serves as a mirrored current output port, and the emitter 12 is coupled to receive a DC current shown as $I_{DC}$, provided by way of a voltage (e.g., VCC) supply rail.

Also shown in FIG. 1 is the transistor's parasitic base-collector capacitance 14, and an AC (noise) signal source 20 that represents the spurious wide spectrum AC signals associated with the VCC power supply rail. As these spurious noise components are imparted principally across the base-collector junction of the transistor 10, the AC noise source 20 (referenced to ground) is shown as applying an AC voltage $V_{AC20}$ across the base 11 and collector 13 through the load resistor 16.

The AC load voltage $V_{16AC}$ across the load 16 may be approximated as:

$$V_{16AC}=V_{AC20}*(R_{16}/(R_{16}+1/sC_{14})), \quad (1)$$

or $$V_{16AC}=V_{AC20}*(sR_{16}C_{14})/(1+sR_{16}C_{14}). \quad (2)$$

From equation (2), it can be seen that as spurious signal components increase, particularly at high frequencies, the AC load voltage component associated with such components also increases.

SUMMARY OF THE INVENTION

In accordance with the present invention, this problem is effectively obviated by coupling a compensating by-pass circuit in parallel with the controlled electronic device in a manner that is effective to decrease the spurious AC signal-coupling of the parasitic component, such that the amplitude of the unwanted AC noise voltage across the load element is very significantly reduced, or effectively minimized. In particular, the compensation circuit of the invention couples a matched electronic component having a parasitic component of its own, in a by-pass path with the compensated device. The parametric values of the transfer function of the electronic device in the by-pass compensation circuit are such as to attenuate the unwanted AC noise voltage across the load, by a factor that approximates the amplitude of the spurious signal, thereby effectively minimizing its unwanted contribution to the load voltage.

For the case of the circuit example of FIG. 1, the compensation by-pass circuit includes an auxiliary bipolar transistor, whose polarity and geometry match that of the transistor 10. This auxiliary transistor has its base and emitter coupled in common with the emitter of the compensated transistor, and its collector coupled through an auxiliary resistor to the ground-referenced end of the load resistor. Like transistor 10, the auxiliary transistor has a parasitic base-collector capacitance.

As the spurious AC voltage signal is tracked by the emitter of is thereby applied across the collector-base junction of the auxiliary transistor, the current flowing into the emitter of the compensated transistor may be expressed as the difference between the DC input current and the spurious voltage divided by the impedance parameters of the compensation circuit. Due to the parametric values of the transfer function of the electronic device in the by-pass compensation circuit, this implies that the collector current of the compensated transistor may be defined as a relatively large fraction of the difference between the DC input current and the product of the spurious voltage and the parasitic capacitance.

Since the current flowing through the load resistor is the sum of the current flowing through the parasitic capacitor of the compensated transistor and the current flowing out of the collector of the compensated transistor, the current through the load resistor is proportional to the difference between the spurious signal voltage and the product of the spurious signal voltage and this relatively large fraction (or attenuation factor). This results in the amplitude of the unwanted AC noise voltage across the load being very significantly reduced (minimized) over a broad range of noise frequencies. Moreover, properties of the compensated circuit are such that at lower frequencies the value of the auxiliary resistor can be effectively reduced to zero, so as to save components, without effectively reducing the relatively large attenuation factor.

DETAILED DESCRIPTION

Figure 1:
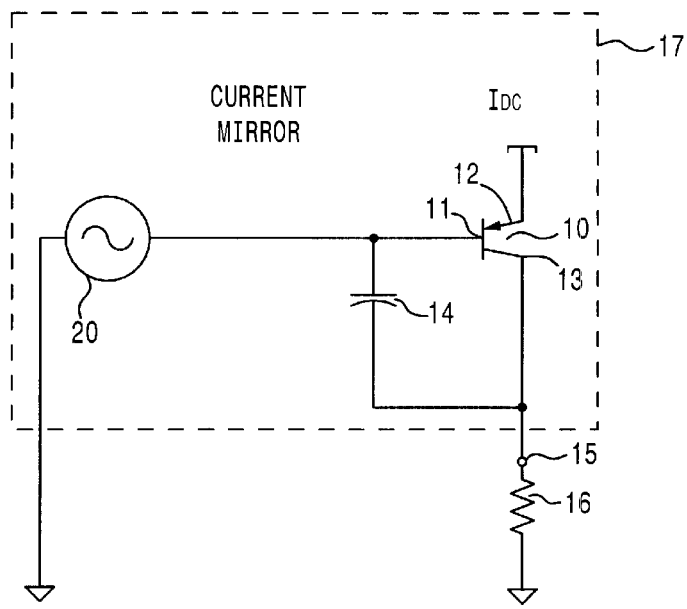
FIG. 1 diagrammatically illustrates a reduced complexity circuit example of the spurious AC signal coupling effect of a parasitic base-capacitor of a bipolar transistor.
Figure 2:
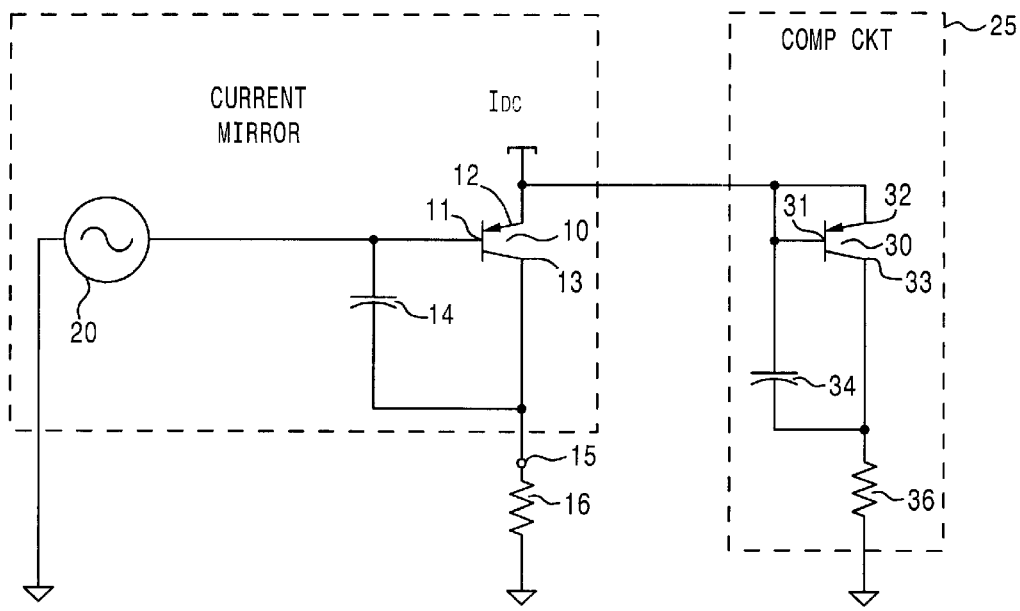
FIG. 2 shows a modification of the circuit of FIG. 1 to incorporate a parasitic component-compensation circuit in accordance with the invention.

Attention is now directed to FIG. 2, which shows the manner in which the reduced complexity circuit example of FIG. 1, described above, may be modified to include a compensation circuit 25 coupled with the controlled electronic device (transistor 10), in a manner that is effective to decrease the spurious AC signal-coupling action of the controlled device's parasitic component (base-collector capacitance 14), such that the amplitude of the unwanted AC noise voltage across the load element is minimized.

In particular, the compensation circuit 25 comprises a second or auxiliary bipolar PNP transistor 30, whose geometry matches that of transistor 30, has its base 31 and emitter 32 coupled in common with the emitter 12 of the compensated transistor 10, and its collector 33 coupled through an auxiliary resistor 36 (which is of the same value as load resistor 16) to the ground-referenced end of load resistor 16. Like transistor 10, transistor 30 has a parasitic base-collector capacitance 34. The circuit of FIG. 2 operates as follows:

The spurious AC voltage signal produced by AC voltage source 20 is tracked by emitter 32 and thereby applied across the collector-base junction of transistor 30. As a consequence, the current $I_{12}$ flowing into the emitter 12 of transistor 10 is now expressed as:

$$I_{12} = I_{DC} - V_{AC20} * (1/(R_{36} + 1/sC_{34})),$$

or $$I_{12} = I_{DC} - V_{AC20} * (sC_{34})/(1 + sR_{36}C_{34}). \quad (3)$$

The collector current $I_{13}$ of transistor 13 may be expressed as:

$$I_{13} = \alpha_p I_{12} = \alpha_p I_{DC} - \alpha_p * V_{AC20} \cdot (sC_{34})/(1 + sR_{36}C_{34}). \quad (4)$$

Since the current $I_{16}$ flowing through the load resistor 16 is the sum of the current $I_{14}$ flowing through the parasitic capacitor 14 and the current $I_{13}$ flowing out of the collector 13 of transistor 10, then the current $I_{16}$ through the load resistor 16 may be expressed as:

$$I_{16} = I_{14} + I_{13}, \quad (5)$$

or $$I_{16} = V_{AC20} * (sC_{14})/(1 + sR_{16}C_{14}) + \alpha_p I_{DC} - \alpha_{92} * V_{AC20} * (sC_{34})/(1 + sR_{36}C_{34}). \quad (6)$$

Therefore, the load component $I_{AC16}$ of the current through load resistor 16 may be expressed as:

$$I_{AC16} = sV_{AC20}(C_{14}/(1 + sR_{16}C_{14}) - \alpha_p sC_{34}/(1 + sR_{36}C_{34})). \quad (7)$$

For equal geometries of transistors 10 and 30 and equal valued resistors 16 and 36, as noted above, equation (7) may be rewritten as:

$$I_{AC16} = (1 - \alpha_p) * sV_{AC20}C_{14,34}/(1 + sR_{16,36}C_{14,34}). \quad (8)$$

A comparison of equation (8) with equation (2) reveals that at very high frequencies, without the presence of the compensation circuit 25, the load voltage $V_{16AC}$ across the load resistor 16 approaches the value of the spurious AC voltage $V_{AC20}$. However, with the compensation circuit 25 of FIG. 2, the value of the spurious voltage $V_{AC20}$ is attenuated by a factor of $(1 - \alpha_p) = 1/(\beta_p 1)$.

Equation (7) also reveals that for frequencies much lower than $(2\pi R_{16}C_{14})^{-1}$, the value $R_{36}$ of auxiliary resistor 36 can be effectively reduced to zero, so as to save components, and equation (8) becomes:

$$I_{AC16} = (1 - \alpha_p) * sV_{AC20}C_{14,34}, \quad (9)$$

in which the attenuation factor $(1 - \alpha_p)$ still holds. Namely, with the incorporation of the compensation circuit of the invention, which couples a matched electronic component having an offsetting parasitic component of its own, in a by-pass path with the parasitic component of the compensated device, the amplitude of the unwanted AC noise voltage across the load is very significantly reduced (minimized) over a broad range of noise frequencies.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art.

What is claimed is:

1. For use with an electronic circuit having a first electronic device configured to deliver current to a load coupled thereto, wherein spurious AC signals are coupled by a parasitic component of said first electronic device to said load, a method of substantially attenuating said spurious AC signals in said load comprising the steps of:

(a) providing an auxiliary electronic device corresponding to said first electronic device and including a like auxiliary parasitic component to that of said first electronic device; and (b) coupling said auxiliary electronic device in circuit with said first electronic device such that said auxiliary parasitic component draws a parasitic current therethrough in accordance with a prescribed relationship with current applied to said first electronic device, and reduces the amplitude of said spurious AC signals through said load in proportion to said prescribed relationship, wherein said first electronic circuit device comprises a first transistor having an input electrode, an output electrode and a control electrode, said output electrode being coupled to said load, and wherein said spurious AC signals are effectively coupled across said control electrode and said load, with said parasitic component thereof being coupled between said control and output electrodes, and wherein said auxiliary electronic device comprises a second transistor having an input electrode and a control electrode coupled to said input electrode of said first transistor, and an output electrode coupled to an auxiliary load, and wherein said like parasitic component thereof being coupled between said control and output electrodes of said second transistor.

2. A method according to claim 1, wherein parametric values of the transfer function of said auxiliary electronic device are such as to attenuate said spurious AC signals through said load by a factor that approximates the amplitude of said spurious AC signal, and thereby effectively minimizes its unwanted contribution to load voltage.

3. For use with an electronic circuit having a first electronic device configured to deliver current to a load coupled thereto, wherein spurious AC signals are coupled by a parasitic component of said first electronic device to said load, a method of substantially attenuating said spurious AC signals in said load comprising the steps of:

(a) providing an auxiliary electronic device corresponding to said first electronic device and including a like auxiliary parasitic component to that of said first electronic device; and (b) coupling said auxiliary electronic device in circuit with said first electronic device such that said auxiliary parasitic component draws a parasitic current therethrough in accordance with a prescribed relationship with current applied to said first electronic device, and reduces the amplitude of said spurious AC signals through said load in proportion to said prescribed relationship, wherein said first electronic circuit device comprises a first bipolar transistor having an emitter, a collector and a base, said collector being coupled to said load, and wherein said spurious AC signals are effectively coupled across said base and said load, with said parasitic component thereof comprising a parasitic base-collector capacitor, and wherein said auxiliary electronic device comprises a second bipolar transistor having an emitter and base coupled to said base of said first transistor, and its collector coupled to an auxiliary load, and wherein said like parasitic component comprises a like parasitic base-collector capacitor.

4. A method according to claim 3, wherein said auxiliary load has an effectively zero value.

5. A circuit comprising:

a first bipolar transistor having an emitter, a collector and a base, said collector being coupled to a load, and wherein a spurious AC voltage associated with DC power terminals for said circuit is coupled by a parasitic base-collector capacitor of said first bipolar transistor to said load; and a compensation circuit for substantially attenuating said spurious AC voltage across said load, said compensation circuit including an auxiliary bipolar transistor having an emitter and a base thereof coupled to said base of said first transistor, and a collector coupled to an auxiliary load, and including an auxiliary parasitic base-collector capacitor, so that said spurious AC voltage is tracked by the emitter of said auxiliary transistor and is applied across the collector-base junction of said auxiliary transistor, such that a transfer function of said second transistor provides a current flow attenuation factor therethrough that approximates that of said first transistor, and AC current through said load is proportional to the difference between said spurious AC voltage and the product of said spurious AC voltage and said attenuation factor that results in the amplitude of said spurious AC voltage across said load being minimized over a broad range of frequencies of said spurious AC voltage.

6. A circuit according to claim 5, wherein said auxiliary load has an effectively zero resistance value.

7. A compensation circuit for an electronic circuit having a first electronic device configured to deliver current to a load coupled thereto, wherein spurious AC signals are coupled by a parasitic component of said first electronic device to said load, a method of substantially attenuating said spurious AC signals in said load, said compensation circuit comprising:

an auxiliary electronic device corresponding to said first electronic device and including a like auxiliary parasitic component to that of said first electronic device; and an auxiliary load; and wherein said auxiliary electronic device in circuit with said first electronic device and said auxiliary load such that said auxiliary parasitic component draws a parasitic current in accordance with a prescribed relationship with current applied to said first electronic device, and reduces the amplitude of said spurious AC signals through said load in proportion to said prescribed relationship, wherein said first electronic circuit device comprises a first transistor having an input electrode, an output electrode and a control electrode, said output electrode being coupled to said load, and wherein said spurious AC signals are effectively coupled across said control electrode and said load, with said parasitic component thereof being coupled between said control and output electrodes, and wherein said auxiliary electronic device comprises a second transistor having an input electrode and a control electrode coupled to said input electrode of said first transistor, and an output electrode coupled to an auxiliary load, and wherein said like parasitic component thereof being coupled between said control and output electrodes of said second transistor.

8. A compensation circuit according to claim 7, wherein parametric values of the transfer function of said auxiliary electronic device are such as to attenuate said spurious AC signals through said load by a factor that approximates the amplitude of said spurious AC signal, and thereby effectively minimizes its unwanted contribution to load voltage.

9. A compensation circuit for an electronic circuit having a first electronic device configured to deliver current to a load coupled thereto, wherein spurious AC signals are coupled by a parasitic component of said first electronic device to said load, a method of substantially attenuating said spurious AC signals in said load, said compensation circuit comprising:

an auxiliary electronic device corresponding to said first electronic device and including a like auxiliary parasitic component to that of said first electronic device; and an auxiliary load; and wherein said auxiliary electronic device in circuit with said first electronic device and said auxiliary load such that said auxiliary parasitic component draws a parasitic current in accordance with a prescribed relationship with current applied to said first electronic device, and reduces the amplitude of said spurious AC signals through said load in proportion to said prescribed relationship, wherein said first electronic circuit device comprises a first bipolar transistor having an emitter, a collector and a base, said collector being coupled to said load, and wherein said spurious AC signals are effectively coupled across said base and said load, with said parasitic component thereof comprising a parasitic base-collector capacitor, and wherein said auxiliary electronic device comprises a second bipolar transistor having an emitter and base coupled to said base of said first transistor, and its collector coupled to an auxiliary load, and wherein said like parasitic component comprises a like parasitic base-collector capacitor.

10. A compensation circuit according to claim 9, wherein said auxiliary load has an effectively zero value.

* * * * *